(12) United States Patent
Kim

(10) Patent No.: US 12,243,755 B2
(45) Date of Patent: Mar. 4, 2025

(54) CARRIER FILM DISPOSED ON A MOTHER SUBSTRATE AND METHOD OF MANUFACTURING A SEMICONDUCTOR PACKAGE

(71) Applicant: SAMSUNG ELECTRONICS CO., LTD., Suwon-si (KR)

(72) Inventor: Taesung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/237,115

(22) Filed: Aug. 23, 2023

(65) Prior Publication Data

US 2023/0395397 A1    Dec. 7, 2023

Related U.S. Application Data

(63) Continuation of application No. 17/232,328, filed on Apr. 16, 2021, now Pat. No. 11,764,079.

(30) Foreign Application Priority Data

Nov. 23, 2020    (KR) .................. 10-2020-0157492

(51) Int. Cl.
*H01L 23/31*    (2006.01)
*H01L 21/56*    (2006.01)

(52) U.S. Cl.
CPC .......... *H01L 21/561* (2013.01); *H01L 21/568* (2013.01); *H01L 23/31* (2013.01); *H01L 23/3128* (2013.01)

(58) Field of Classification Search
None
See application file for complete search history.

(56) References Cited

U.S. PATENT DOCUMENTS

| | | | |
|---|---|---|---|
| 5,834,848 A * | 11/1998 | Iwasaki | H05K 3/303 257/E21.503 |
| 8,168,525 B2 | 5/2012 | Masuda | |
| 2004/0038451 A1 | 2/2004 | Hawks et al. | |
| 2005/0048306 A1 | 3/2005 | Suzuki et al. | |
| 2006/0060636 A1 | 3/2006 | Daves et al. | |

(Continued)

FOREIGN PATENT DOCUMENTS

| | | |
|---|---|---|
| JP | 2003-332280 A | 11/2003 |
| JP | 2007-189007 A | 7/2007 |

(Continued)

OTHER PUBLICATIONS

Office Action dated Jan. 21, 2025 for corresponding application No. KR 10-2020-0157492.

*Primary Examiner* — Jay C Chang
(74) *Attorney, Agent, or Firm* — Muir Patent Law, PLLC

(57) ABSTRACT

A carrier film for performing a semiconductor package process on a mother substrate including a multi-layer circuit, a mother substrate, and a method of manufacturing a semiconductor package, the carrier film including a base material layer having a predetermined stiffness; and an adhesive layer configured to attach the base material layer onto the mother substrate, the adhesive layer including a water soluble material, wherein the carrier film includes a plurality of openings passing therethrough from a top surface to a bottom surface thereof.

19 Claims, 15 Drawing Sheets

(56) References Cited

U.S. PATENT DOCUMENTS

| | | |
|---|---|---|
| 2008/0003780 A1 | 1/2008 | Sun et al. |
| 2008/0290513 A1* | 11/2008 | Byun .................... H01L 21/561 257/738 |
| 2010/0171212 A1 | 7/2010 | Chen |
| 2013/0313012 A1 | 11/2013 | Yang et al. |
| 2019/0181347 A1* | 6/2019 | Ishitsuka .............. H10K 85/151 |
| 2019/0378728 A1 | 12/2019 | Matsuura et al. |

FOREIGN PATENT DOCUMENTS

| | | |
|---|---|---|
| KR | 10-2011-0076191 A | 7/2011 |
| KR | 10-1056692 B1 | 8/2011 |
| KR | 10-2017-0108322 A | 9/2017 |

* cited by examiner

CARRIER FILM DISPOSED ON A MOTHER SUBSTRATE AND METHOD OF MANUFACTURING A SEMICONDUCTOR PACKAGE

CROSS-REFERENCE TO THE RELATED APPLICATIONS

This is a continuation application based on application Ser. No. 17/232,328, filed Apr. 16, 2021, the entire contents of which is hereby incorporated by reference.

Korean Patent Application No. 10-2020-0157492, filed on Nov. 23, 2020, in the Korean Intellectual Property Office, and entitled: "Carrier Film, Mother Substrate, and Method of Manufacturing Semiconductor Package by Using the Carrier Film and the Mother Substrate," is incorporated by reference herein in its entirety.

BACKGROUND

1. Field

Embodiments relate to a carrier film, a mother substrate, and a method of manufacturing a semiconductor package by using the carrier film and the mother substrate.

2. Description of the Related Art

As portable electronic products are miniaturized, a thickness of a substrate for a semiconductor package process is progressively thinned.

SUMMARY

The embodiments may be realized by providing a carrier film for performing a semiconductor package process on a mother substrate including a multi-layer circuit, the carrier film including a base material layer having a predetermined stiffness; and an adhesive layer configured to attach the base material layer onto the mother substrate, the adhesive layer including a water soluble material, wherein the carrier film includes a plurality of openings passing therethrough from a top surface to a bottom surface thereof.

The embodiments may be realized by providing a mother substrate that is holdable on a carrier film, the mother substrate including a first surface including a plurality of solder ball areas including a plurality of solder balls thereon, and a first open area including the plurality of solder ball areas; a second surface with a semiconductor chip mounted thereon; and a multi-layer circuit between the first surface and the second surface, wherein a thickness of the mother substrate between the first surface and the second surface is less than about 80 μm, and the carrier film includes a water-soluble adhesive layer and a first opening, the carrier film being attachable on the first surface such that the first open area is aligned with the first opening.

The embodiments may be realized by providing a method of manufacturing a semiconductor package, the method including providing a mother substrate on which a carrier film including a water-soluble adhesive layer is attached, the mother substrate including a first surface partially exposed by the attached carrier film, and a second surface opposite to the first surface; physically polishing the second surface of the mother substrate to remove a portion of the mother substrate; mounting a semiconductor chip on the second surface; forming a molding material surrounding an edge of the semiconductor chip, on the second surface; forming a solder ball in the partially exposed region of the first surface; and performing a washing process to detach the carrier film and to remove a particle from the solder ball and a residue remaining on the partially exposed region of the first surface.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
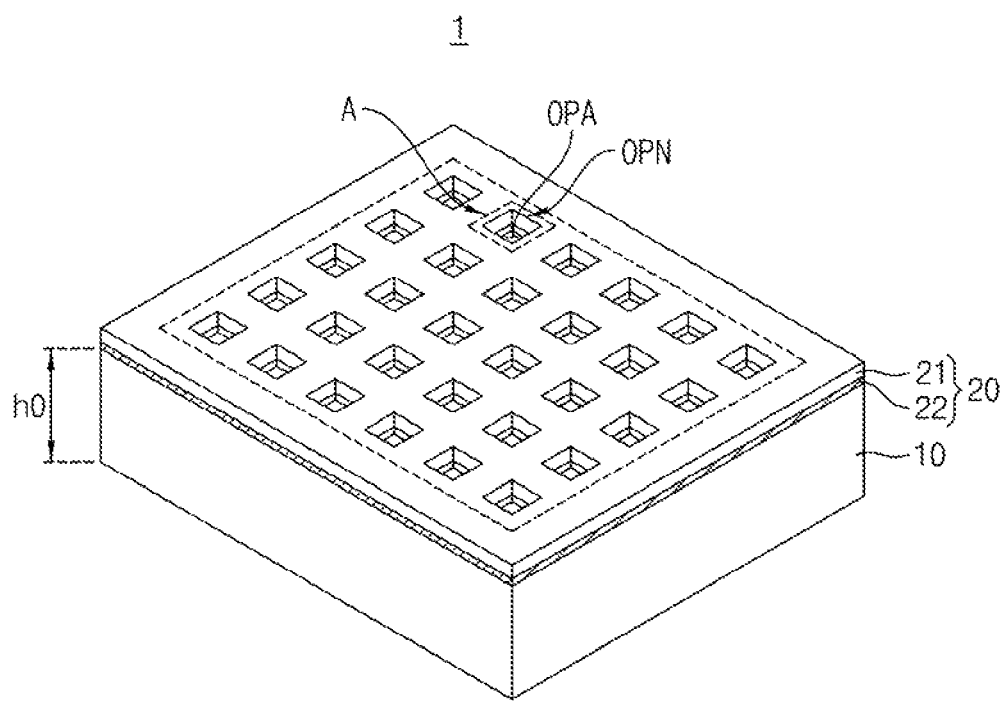
FIG. 1 is a perspective view of a mother substrate with a carrier film attached thereon, according to an embodiment of the disclosure.
Figure 2:
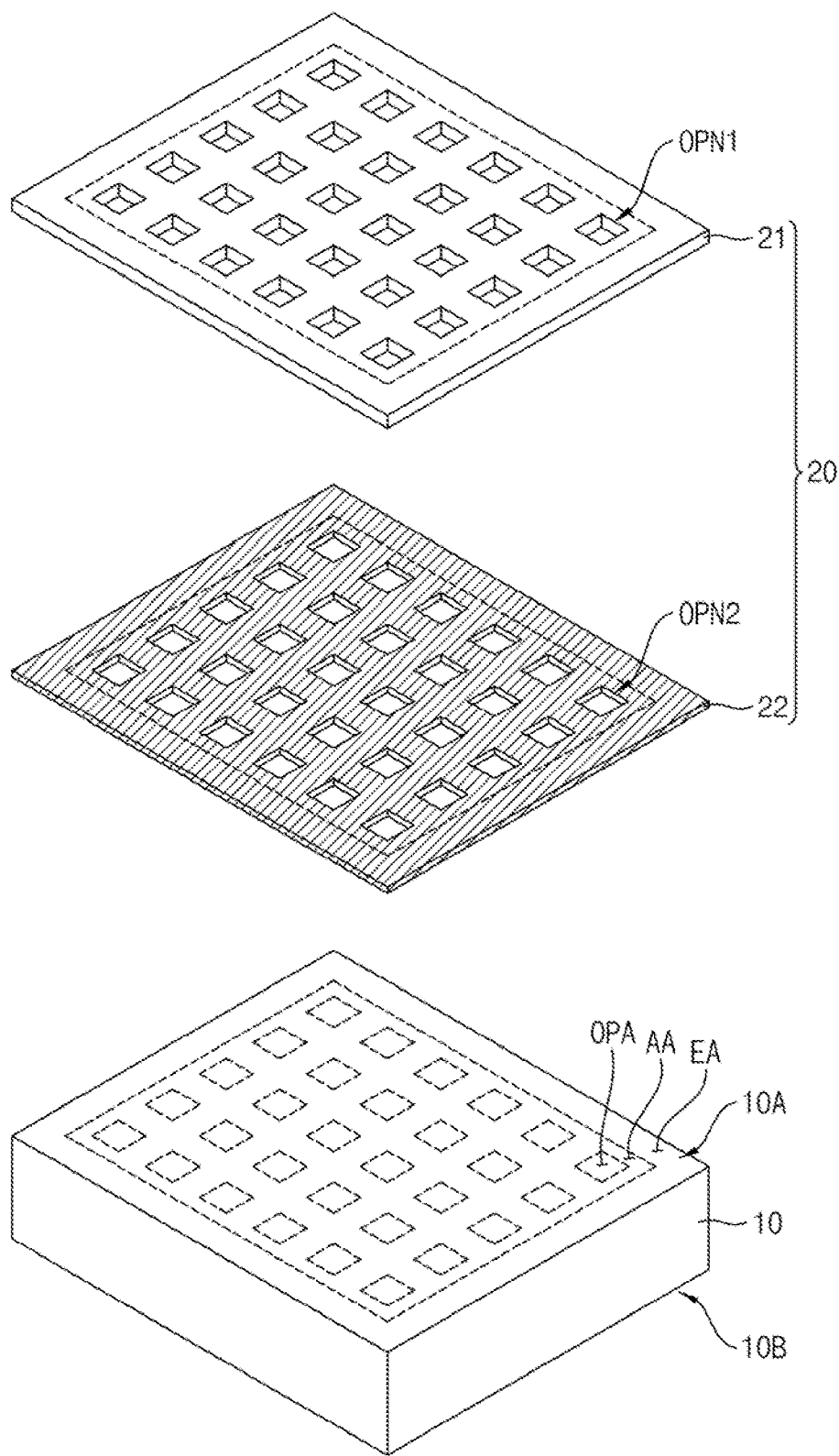
FIG. 2 is an exploded perspective view of a carrier film and a mother substrate, according to an embodiment.

FIG. 1 is a perspective view of a mother substrate 10 with a carrier film 20 attached thereon, according to an embodiment of the disclosure. FIG. 2 is an exploded perspective view of the carrier film 20 and the mother substrate 10, according to an embodiment.

Referring to FIGS. 1 and 2, the carrier film 20 may be attached on one surface of the mother substrate 10. In an implementation, the mother substrate 10 may be a type 1 with the carrier film 20 attached thereon in a semiconductor package process.

In an implementation, the mother substrate 10 may be a substrate that includes a wiring therein for mounting a semiconductor chip thereon. In an implementation, the mother substrate 10 may be a printed circuit board (PCB). In an implementation, the mother substrate 10 may be a flexible PCB, a silicon base substrate, a glass substrate, a ceramic substrate, or an insulation circuit substrate.

The mother substrate 10 may be a multi-layer circuit substrate that includes a first surface 10A, a second surface 10B, a via passing through a region between the first surface 10A and the second surface 10B, and various circuits between the first surface and the second surface 10B. A plurality of semiconductor packages may be manufactured by using one mother substrate 10. In an implementation, in order to decrease costs, a plurality of semiconductor packages may be manufactured based on a process of mounting a plurality of semiconductor chips on one mother substrate 10 and then detaching the plurality of semiconductor chips therefrom. In an implementation, the mother substrate 10 may be each substrate configuring one semiconductor package.

The mother substrate 10 may include the first surface 10A with the carrier film or a carrier substrate attached thereon, and the second surface 10B with a semiconductor chip mounted thereon. In an implementation, the first surface 10A and the second surface 10B may be surfaces opposite to each other. A partial region of the first surface 10A of the mother substrate 10 may include an area (e.g., see SA of FIG. 3) where a plurality of solder balls to be described are formed.

The carrier film 20 may be attached on the first surface 10A of the mother substrate 10. In an implementation, the carrier film 20 may include a base material layer 21 and an adhesive layer 22.

The adhesive layer 22 may be a layer that directly contacts the first surface 10A of the mother substrate 10, and may perform a function of attaching the carrier film 20 (e.g., the base material layer 21) onto the mother substrate 10.

In an implementation, the adhesive layer 22 may include a pressure sensitive adhesive (PSA). The carrier film 20 attached on the mother substrate 10 may be detached from the mother substrate 10 after a semiconductor package process is performed at least partially. In an implementation, the carrier film 20 may be detached from the mother substrate 10 through a washing process. To this end, the adhesive layer 22 may include a water soluble material. In an implementation, the water soluble material of the adhesive layer 22 may include poly vinyl acetate (PVAc), water soluble polyurethane (PU), water soluble poly vinyl alcohol (PVA), carboxymethyl cellulose (CMC), carboxymethyl starch (CMS), or a compound thereof. In an implementation, the water soluble material of the adhesive layer 22 may include a biodegradable material such as starch and vegetable oil. The adhesive layer 22 may include other materials having an adhesive force and a water soluble component. As used herein, the term "or" is not an exclusive term, e.g., "A or B" would include A, B, or A and B.

The base material layer 21 may perform a function of a carrier for substantially supporting the mother substrate 10 in or during the semiconductor package process. The base material layer 21 may have certain stiffness, e.g., may have stiffness that is greater than that of each of the mother substrate 10 and the adhesive layer 22. In an implementation, the base material layer 21 may have a thickness of about 10 μm to about 300 μm, e.g., about 50 μm to about 250 μm. The stiffness is determined whether equipment deviation has occurred or whether tearing defects are observed, by providing the same external force.

In an implementation, the base material layer 21 may include a polymer material, e.g., polycarbonate (PC), acrylic resin, polyethylene terephthalate (PET), poly ether sulfide (PES), or polysulfone (PS).

In an implementation, the base material layer 21 may include a water soluble material. In this case, in the washing process, the base material layer 21 and the adhesive layer 22 may be easily detached from the mother substrate 10. In an implementation, the water soluble material applied to the base material layer 21 may include PVA, CMC, and CMS, or a compound thereof.

The carrier film 20 may include a plurality of opening portions or openings OPN passing through a top surface to a bottom surface thereof. When seen in a top view, each of the plurality of openings OPN may have a tetragonal shape. In an implementation, when the carrier film 20 is attached on the mother substrate 10, the plurality of openings OPN may expose a portion of the first surface 10A of the mother substrate 10. Each of the plurality of openings OPN may pass through the base material layer 21 and the adhesive layer 22. An opening OPN1 in the base material layer 21 and an opening OPN2 in the adhesive layer 22 may together form the opening OPN described above. In an implementation, the opening OPN1 in the base material layer 21 and the opening OPN2 in the adhesive layer 22 may have a same width. In an implementation, each opening OPN of the carrier film 20 may have the same width, based on a position (e.g., a depth) thereof.

When the carrier film 20 is attached on the mother substrate 10, a partial region of the first surface 10A of the mother substrate 10, exposed by the plurality of openings OPN of the carrier film 20, may be defined as an open area OPA. In an implementation, a width of each open area OPA may be the same width as that of each opening OPN. At least a portion of the open area OPA may include an area (e.g., see SA of FIG. 3) where a plurality of solder balls are formed (e.g., may include a plurality of solder balls thereon). For example, the carrier film 20 is in the form of a tape, and the mother substrate 10 may be a semiconductor circuit substrate used in a semiconductor process or the like.

The mother substrate 10 may include an active area AA and an edge area EA surrounding the edge area AA. When the carrier film 20 is detached from the mother substrate 10, the active area AA may be defined as an area including a substrate of each semiconductor package. The active area AA may include the open area OPA described above. When the carrier film 20 is detached from the mother substrate 10, the edge area EA may be defined as an area that is removed in a certain process. The edge area EA may be an area that does not include the substrate of each semiconductor package. In an implementation, the edge area EA may be at an edge of the active area AA and may not include the open area OPA. In an implementation, the edge area EA may not be exposed by (e.g., may be covered by) the carrier film 20.

Figure 3:
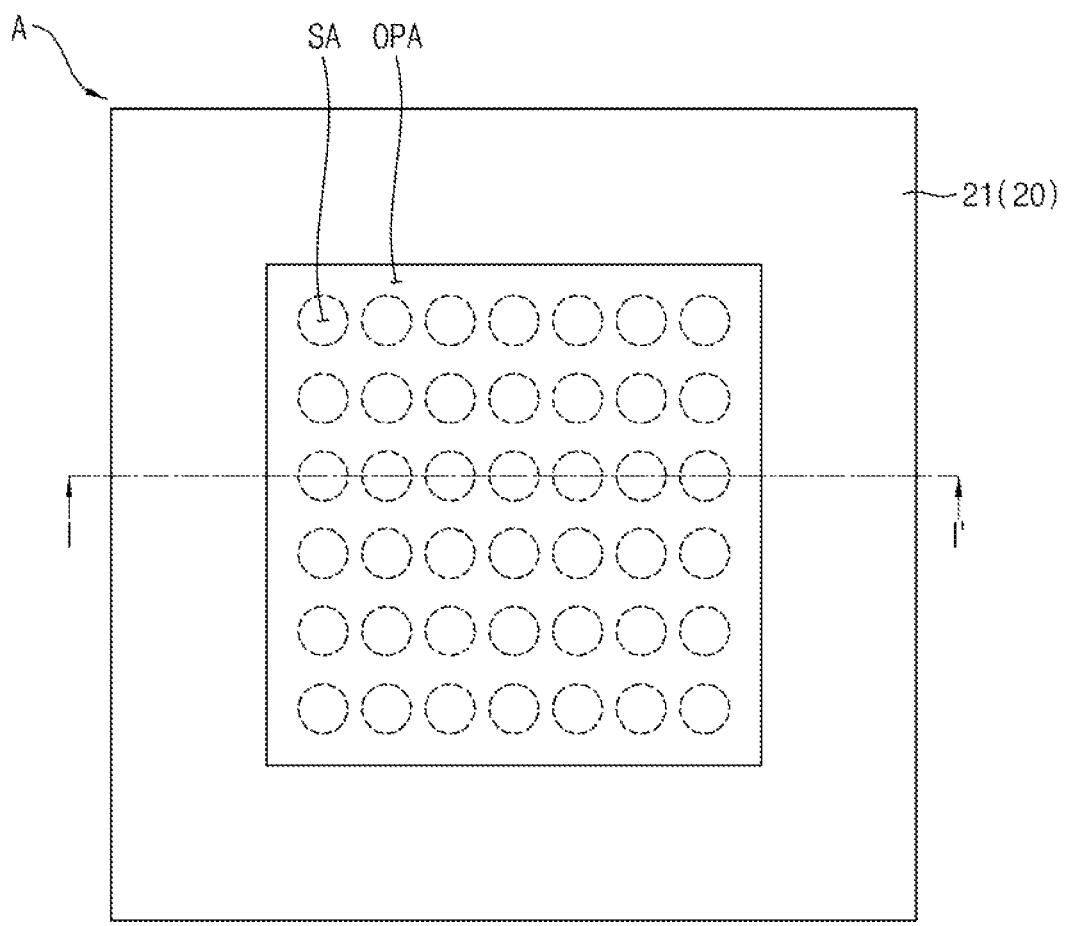
FIG. 3 is an enlarged plan view of region A of FIG. 1.
Figure 4:
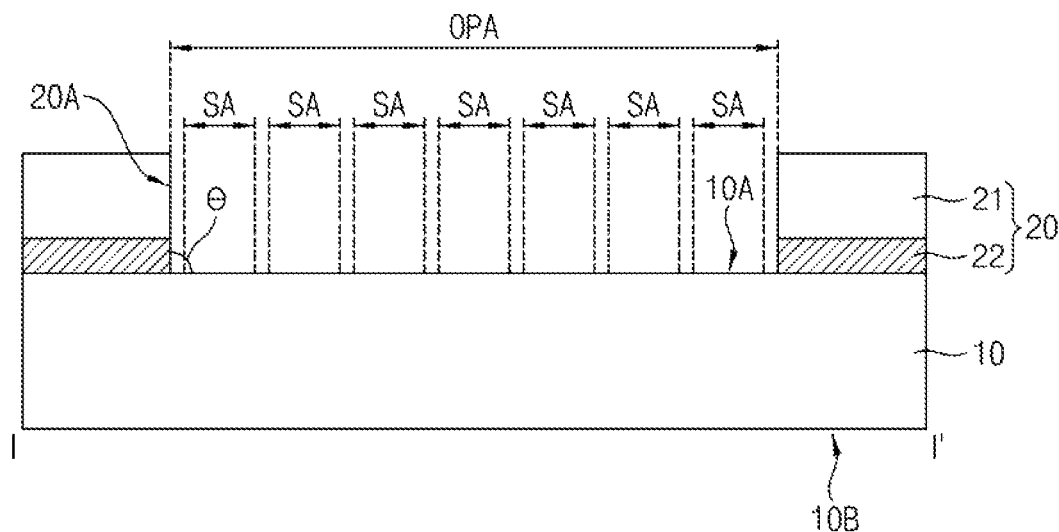
FIG. 4 is a cross-sectional view taken along line I-I' of FIG. 3.

FIG. 3 is an enlarged plan view of a region A of FIG. 1. FIG. 4 is a cross-sectional view taken along line I-I' of FIG. 3. For example, the region A may correspond to a region where a unit substrate for manufacturing one semiconductor package is to be formed.

Referring to FIGS. 1 to 4, each of a plurality of open areas OPA may include a plurality of solder ball areas SA. The plurality of solder ball areas SA may be on the first surface 10A of the mother substrate 10.

In an implementation, the plurality of solder ball areas SA may be spaced apart from one another. In an implementation, outer solder ball areas SA (at an outer portion among the plurality of solder ball areas SA) may not overlap an edge of the open area OPA. In an implementation, a width of the open area OPA or a width of the opening OPN may be set so that each of the plurality of solder ball areas SA is in the open area OPA.

In an implementation, when the carrier film 20 is detached from the mother substrate 10, the plurality of solder ball areas SA may have a high density at a center portion of a unit substrate. In an implementation, in the mother substrate 10, the plurality of solder ball areas SA may have different areas at positions that differ from the illustration, or another open area OPA may include the plurality of solder ball areas SA or other openings OPN of the carrier film 20 may correspond to a position and a width of the open area OPA.

In an implementation, in the carrier film 20, a sidewall 20A of the opening OPN may be formed or extend in a vertical direction. In an implementation, an angle θ between the mother substrate 10 and a portion, which is adjacent to the mother substrate 10, of the sidewall 20A of the opening OPN may roughly be a right angle (e.g., about 90 degrees). In an implementation, the sidewall 20A of the opening OPA may include a sidewall of the base material layer 21 and a sidewall of the adhesive layer 22, at a position at which the opening OPN is defined, and all of the sidewall of the base material layer 21 and the sidewall of the adhesive layer 22 may form (may be vertical) a right angle (90 degrees) with respect to the first surface 10A of the mother substrate 10.

Hereinafter, a process of using and detaching the carrier film 20 in a method of manufacturing a semiconductor package will be described. In the following description, descriptions given above with reference to FIGS. 1 to 4 may be referred to.

FIGS. 5 to 10 are cross-sectional views of stages in a method of manufacturing a semiconductor package, according to an embodiment of the disclosure.

Referring to FIGS. 5 to 10, e.g., the method of manufacturing a semiconductor package may include a physical polishing process S110, a semiconductor chip mounting process S120, a molding process S130, a solder ball forming process S140, and a washing process S150.

Figure 5:
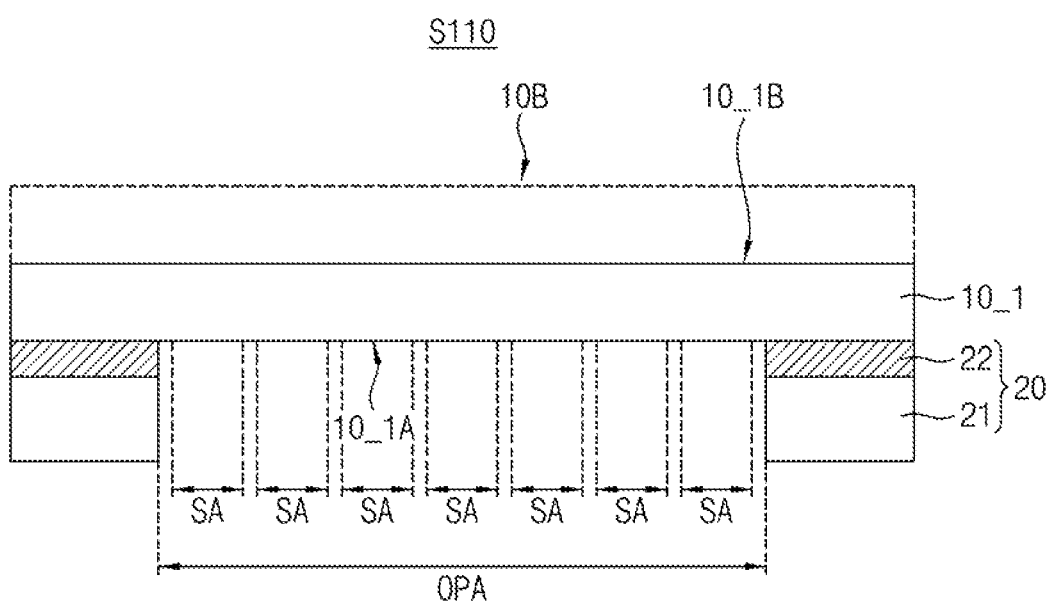
FIGS. 5 to 10 are cross-sectional views of stages in a method of manufacturing a semiconductor package, according to an embodiment of the disclosure.

First, referring to FIG. 5, the second surface 10B of the mother substrate 10 may be removed by a certain thickness. In an implementation, the second surface 10B side of the mother substrate 10 may be removed through the physical polishing process 110 (e.g., a sawing or grinding process). The physical polishing process S110 may be performed after the second surface 10B of the mother substrate 10 is upward attached on the carrier film 20.

After the physical polishing process S110, a thickness of a mother substrate 10_1 may be thinner than before the physical polishing process S110. After the physical polishing process S110, the mother substrate 10_1 may include a first surface 10_1A and a second surface 10_1B, like before the physical polishing process S110. In an implementation, the physical polishing process S110 may be omitted.

Figure 6:
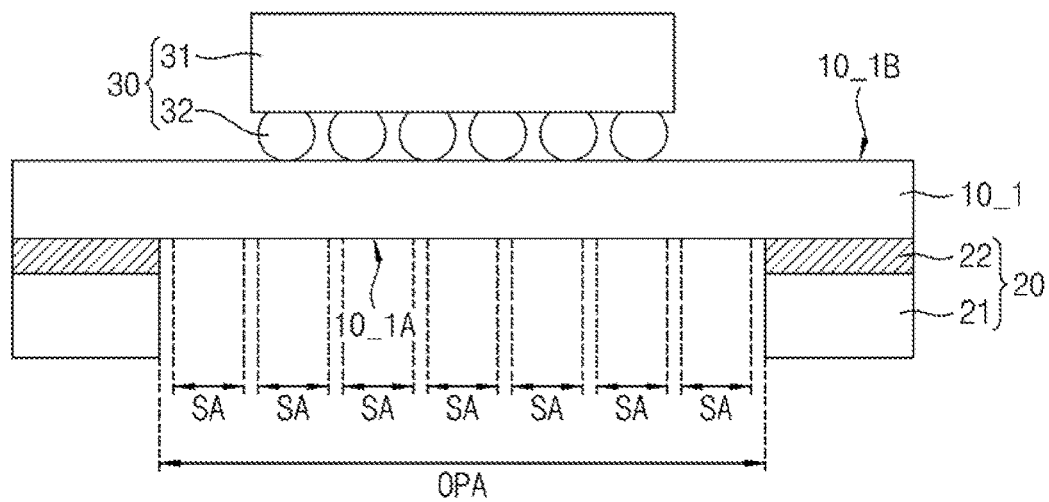

Subsequently, referring to FIG. 6, a semiconductor chip 30 may be mounted on the second surface 10_1B of the mother substrate 10_1. In an implementation, the semiconductor chip 30 may include a chip portion 31 and a plurality of bumps 32 electrically connecting the chip portion 31 to the mother substrate 10_1. The semiconductor chip 30 may be mounted on the second surface 10_1B of the mother substrate 10_1 so that the plurality of bumps 32 contact the second surface 10_1B of the mother substrate 10_1.

In an implementation, the chip portion 31 may be a logic chip, a memory chip, or an interposer. In an implementation, the logic chip may include a core processor, application specific integrated circuit (ASIC), a mobile application processor (AP), or other processing chips. In an implementation, the memory chip may include a non-volatile memory chip, such as dynamic random access memory (DRAM), resistive random access memory (ReRAM), magnetoresistive random access memory (MRAM), phase-change random access memory (PRAM), or flash memory, or other suitable memory chips.

The plurality of bumps 32 may include a conductive material. In an implementation, a position at which the semiconductor chip 30 is mounted may overlap (e.g., may be vertically aligned with) an open area OPA.

Figure 7:
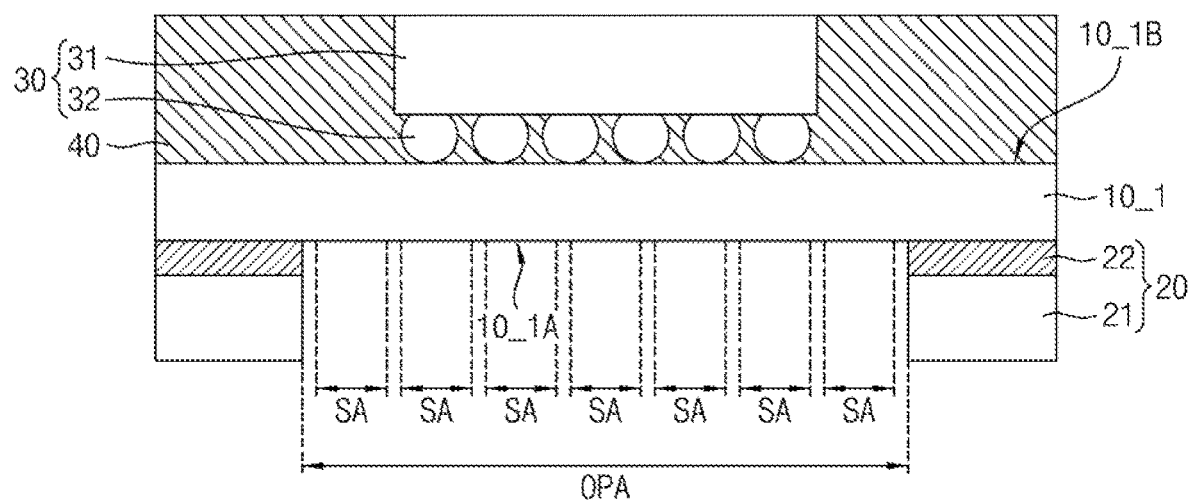

Subsequently, referring to FIG. 7, a molding material 40 may surround a side portion of the semiconductor chip 30 and may expose an upper portion of the semiconductor chip 30. In an implementation, the molding material 40 may be formed to cover all of the side portion and the upper portion of the semiconductor chip 30 and then may be cured, and a portion of the molding material 40 may be removed to expose the upper portion of the semiconductor chip 30, through a chemical mechanical polishing (CMP) process. In an implementation, the molding material 40 may include an epoxy molding compound (EMC) or molded underfill (MUF).

Figure 8:
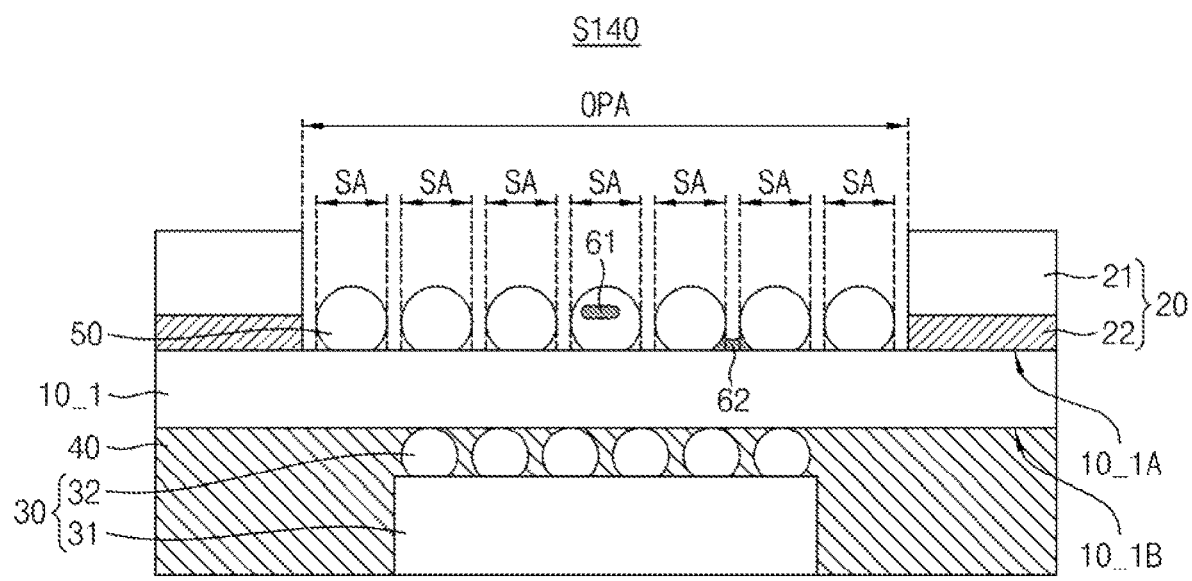

Subsequently, referring to FIG. 8, a process of respectively forming a plurality of solder balls 50 in a plurality of solder ball areas SA on the first surface 10_1A of the mother substrate 10_1 may be performed. In an implementation, each of the solder balls 50 may include a conductive material. In an implementation, a planar width (area) of each solder ball 50 may be the same as a width (area) of each of the solder ball areas SA.

Each solder ball 50 may be individually attached (e.g., adhered), e.g., as a conductive ball, respectively on each solder ball area SA on the first surface 10_1A of the mother substrate 10_1, or may be formed through a deposition process. In an implementation, in the solder ball forming process S140, a particle 61 could be formed on a surface of the solder ball 50, or a residue 62 could be formed in an open area OPA (near the solder ball area SA) on the first surface 10_1A of the mother substrate 10_1.

Figure 9:
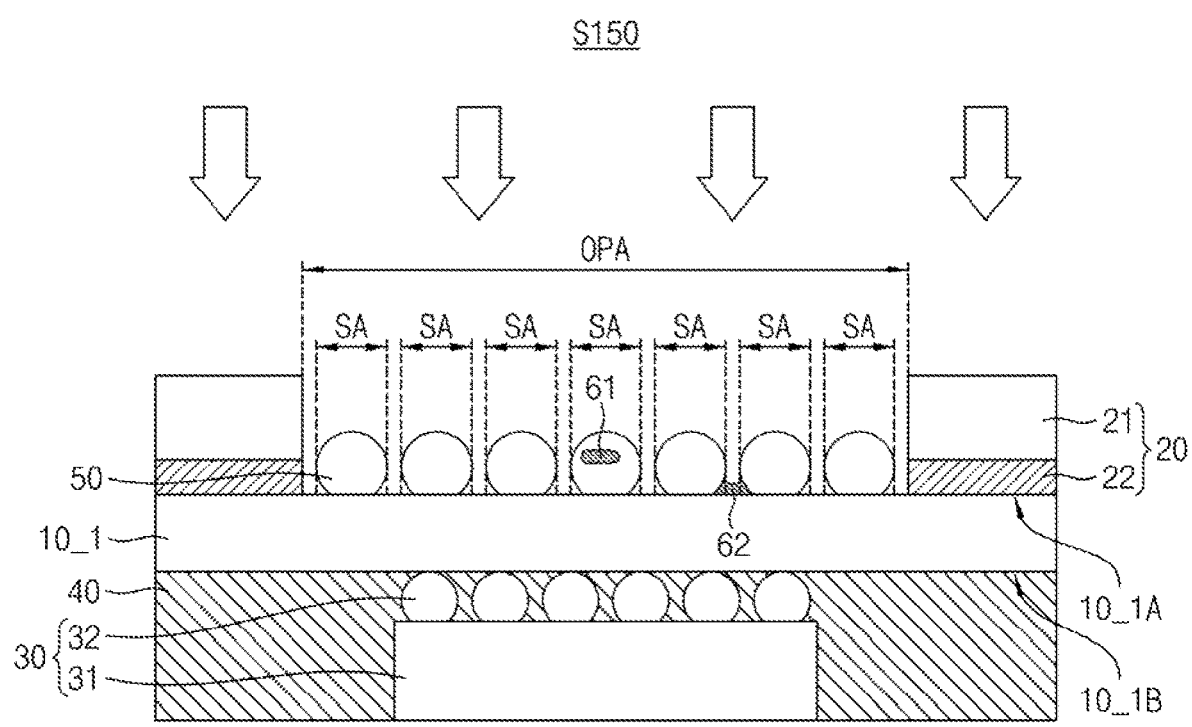
Figure 10:
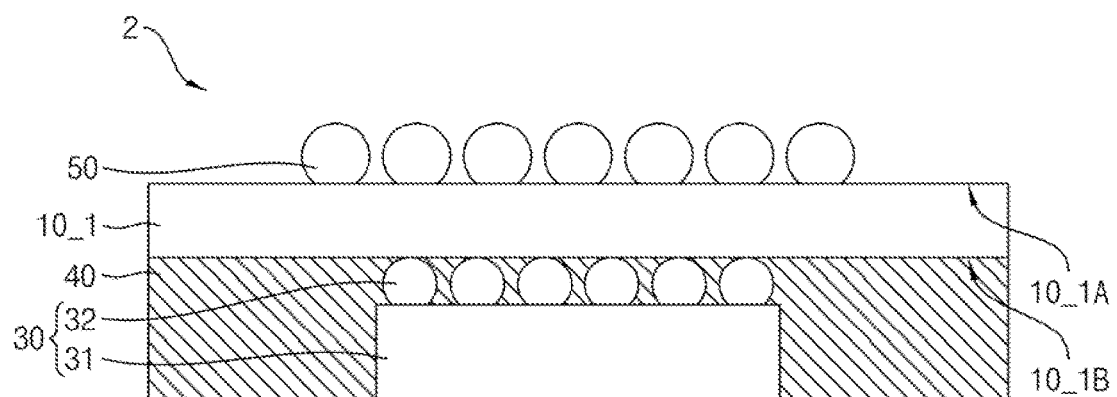

Subsequently, referring to FIGS. 9 and 10, the washing process S150 may be performed. The washing process S150 may be performed to remove the particle 61 or the residue 62 described above.

In an implementation, through the washing process S150, the carrier film 20 attached on the mother substrate 10_1 may be detached from the mother substrate 10_1 along with the particle 61 or the residue 62. In an implementation, the adhesive layer 22 may include a water soluble material, and thus, may be easily dissolved by a solvent in the washing process S150. The adhesive layer 22 for attaching a base material layer 21 on the mother substrate 10_1 may be easily removed in the washing process S150, and thus, the base material layer 21 may be easily detached from the mother substrate 10_1.

In an implementation, the base material layer 21 may also include a water soluble material, and the base material layer 21 and the adhesive layer 22 may be removed by a solvent in the washing process S150.

A semiconductor package 2 may be manufactured through the processes of the method of manufacturing a semiconductor package described above and a desired additional process.

Next, a carrier film and a mother substrate with the carrier film attached thereon according to another embodiment will be described. Hereinafter, descriptions of the same elements as the elements of FIGS. 1 to 10 may be omitted, and like or similar reference numerals refer to like or similar elements.

Figure 11:
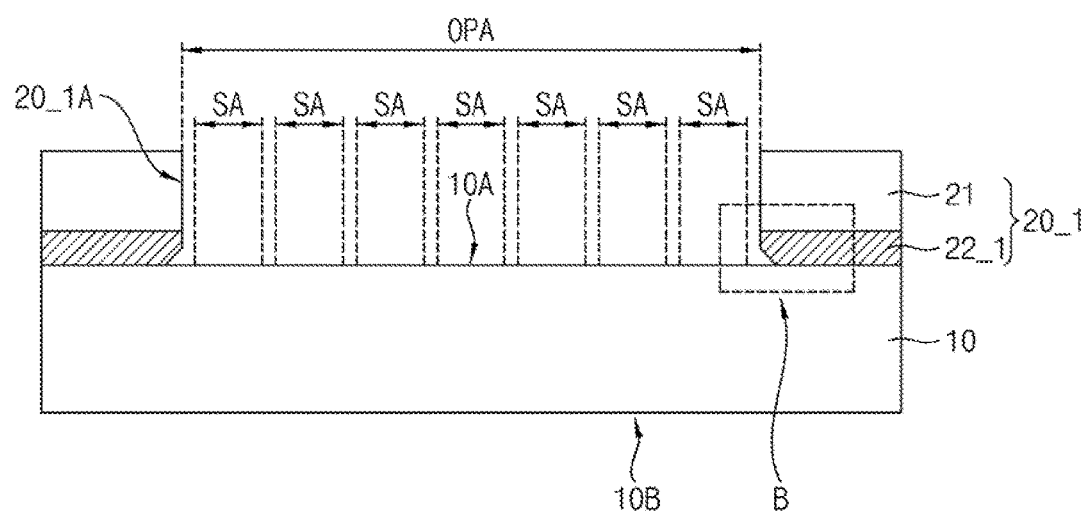
FIG. 11 is a cross-sectional view of a partial region of a mother substrate with a carrier film attached thereon, according to an embodiment of the disclosure.
Figure 12:
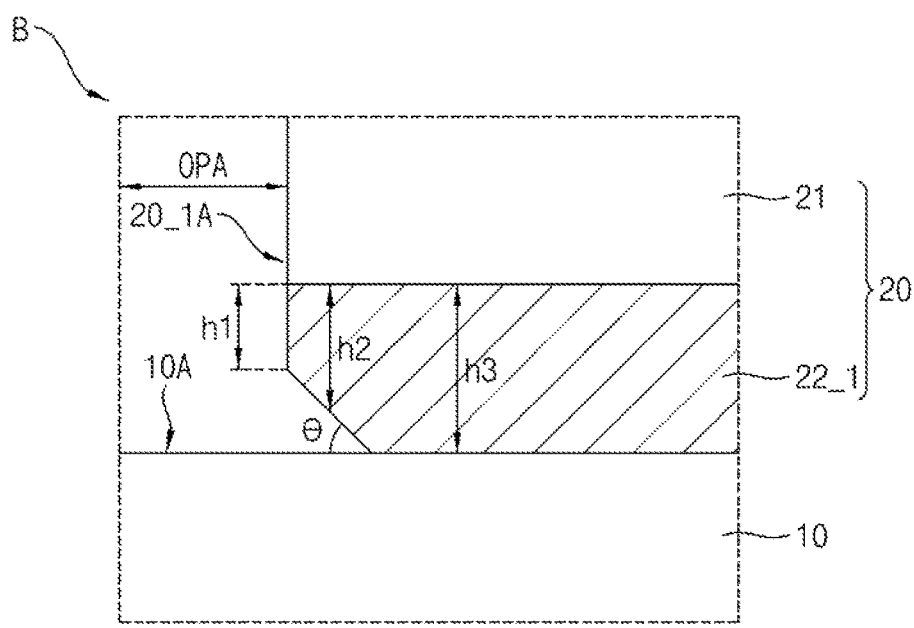
FIG. 12 is an enlarged view of a region B of FIG. 11.

FIG. 11 is a cross-sectional view of a partial region of a mother substrate 10 with a carrier film 20_1 attached thereon, according to an embodiment of the disclosure. FIG. 12 is an enlarged view of a region B of FIG. 11.

Referring to FIGS. 11 and 12, comparing with the carrier film 20 according to the embodiment of FIG. 4, the carrier film 20_1 according to the present embodiment may have a difference in angle θ between a sidewall 20A thereof and the mother substrate 10.

In an implementation, a sidewall 20_1A of the opening OPN in the carrier film 20_1 may include an inclined portion. In an implementation, one portion of the sidewall 20_1A of the opening OPN may roughly form a right angle (90 degrees) with respect to a first surface 10A of the mother substrate 10, and another portion thereof may be inclined to form an acute angle with respect to the first surface 10A of the mother substrate 10. In an implementation, an angle between the mother substrate 10 and a portion of the sidewall 20_1A of the opening OPN in the carrier film 20_1 adjacent to the mother substrate 10 may be an acute angle. In an implementation, the sidewall 20_1A of the base material layer 21 may roughly form a right angle (e.g., about 90 degrees) with respect to the first surface 10A of the mother substrate 10, and a portion of a sidewall 20_1A of the adhesive layer 22_1 (e.g., a portion adjacent to the first surface of the mother substrate 10) may form an acute angle with respect to the first surface of the mother substrate 10.

In an implementation, the adhesive layer 22_1 may have a thickness that varies or is different based on a position. In an implementation, the adhesive layer 22_1 may include a portion where a thickness thereof is thinner in a direction from an inner portion thereof to the opening OPN. In an implementation, the adhesive layer 22_1 may have a first thickness h1 (which is a minimum thickness at a position adjacent to the opening OPN), may have a third thickness h3 (which is a maximum thickness at an inner or interior portion thereof), and may have a second thickness h2 between the portion having the first thickness h1 and the portion having the third thickness h3, e.g., at a position between the interior portion thereof and the opening OPN.

A contact area between the adhesive layer 22_1 and the first surface 10A of the mother substrate 10 may be reduced, and thus, the adhesive layer 22_1 may be easily removed in the washing process S150.

Figure 13:
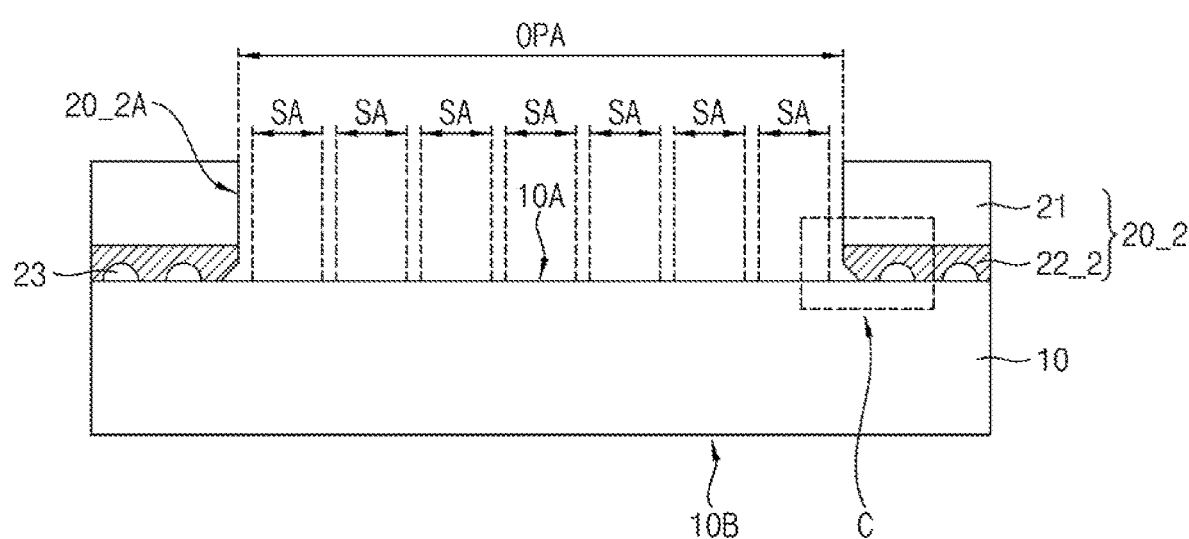
FIG. 13 is a cross-sectional view of a partial region of a mother substrate with a carrier film attached thereon, according to an embodiment of the disclosure.
Figure 14:
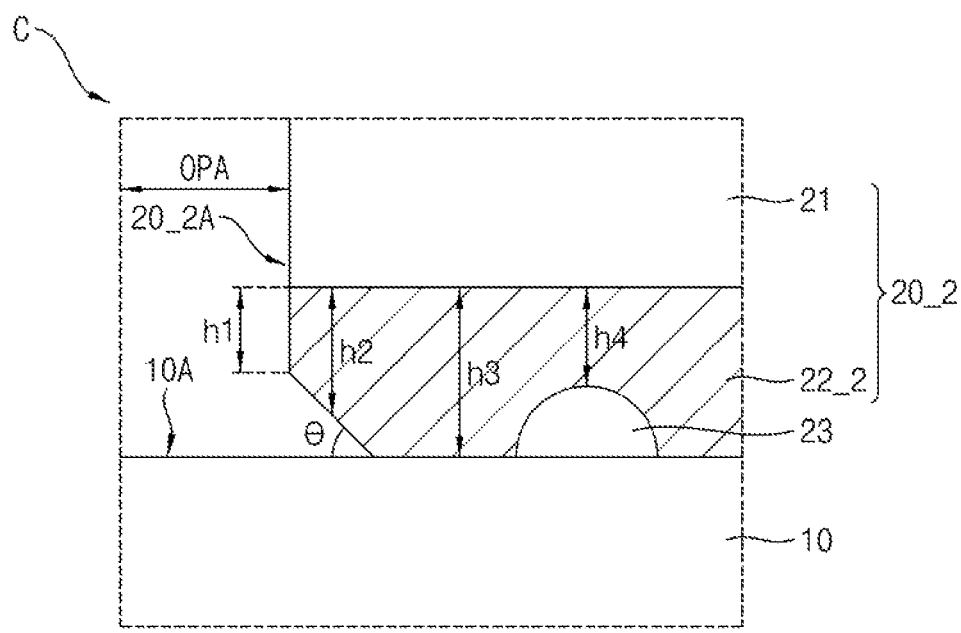
FIG. 14 is an enlarged view of a region C of FIG. 13.

FIG. 13 is a cross-sectional view of a partial region of a mother substrate 10 with a carrier film 20_2 attached thereon, according to an embodiment of the disclosure. FIG. 14 is an enlarged view of a region C of FIG. 13.

Referring to FIGS. 13 and 14, comparing with the carrier film 20 according to the embodiment of FIG. 4, the carrier film 20_2 according to the present embodiment may have a difference in that an adhesive layer 22_2 may include a plurality of grooves 23 in a surface thereof contacting the mother substrate 10.

In an implementation, the plurality of grooves 23 may be formed or extend inwardly in one surface of the adhesive layer 22_2. Due to the plurality of grooves 23, an area where the adhesive layer 22_2 contacts the mother substrate 10 may be reduced. A contact area between the adhesive layer 22_2 and a first surface 10A of the mother substrate 10 may decrease, and thus, the adhesive layer 22_2 may be easily removed in the washing process S150.

In an implementation, the adhesive layer 22_2 may have a thickness that varies or is different based on a position. In an implementation, the adhesive layer 22_2 may include a portion where a thickness thereof is thinner in a direction from an inner portion thereof to the opening OPN. In an implementation, the adhesive layer 22_2 may have a first thickness h1 at a position adjacent to the opening OPN, may have a third thickness h3 (which is a maximum thickness) at an inner or interior portion thereof, and may have a second thickness h2 at a region between the first thickness h1 and the third thickness h3 (e.g., at a position between the inner portion thereof and the opening OPN). Also, the adhesive layer 22_2 may have a fourth thickness h4 (which is thinner than the third thickness h3) at a portion where each of the plurality of grooves 23 is formed.

In an implementation, an angle between the mother substrate 10 and a portion, which is adjacent to the mother substrate 10, of a sidewall 20_2A of the opening OPN may be an acute angle.

Figure 15:
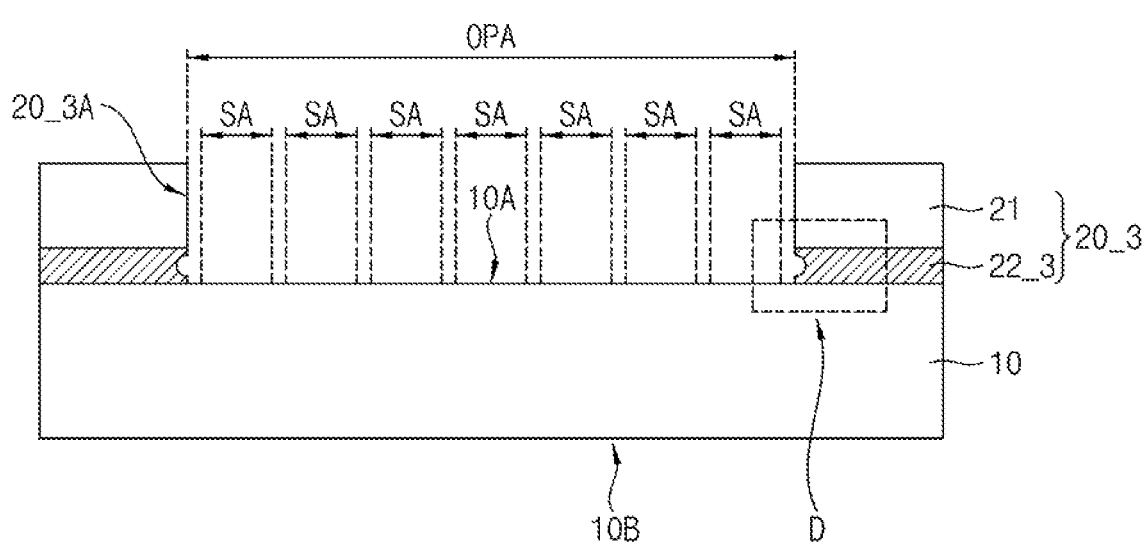
FIG. 15 is a cross-sectional view of a partial region of a mother substrate with a carrier film attached thereon, according to an embodiment of the disclosure.
Figure 16:
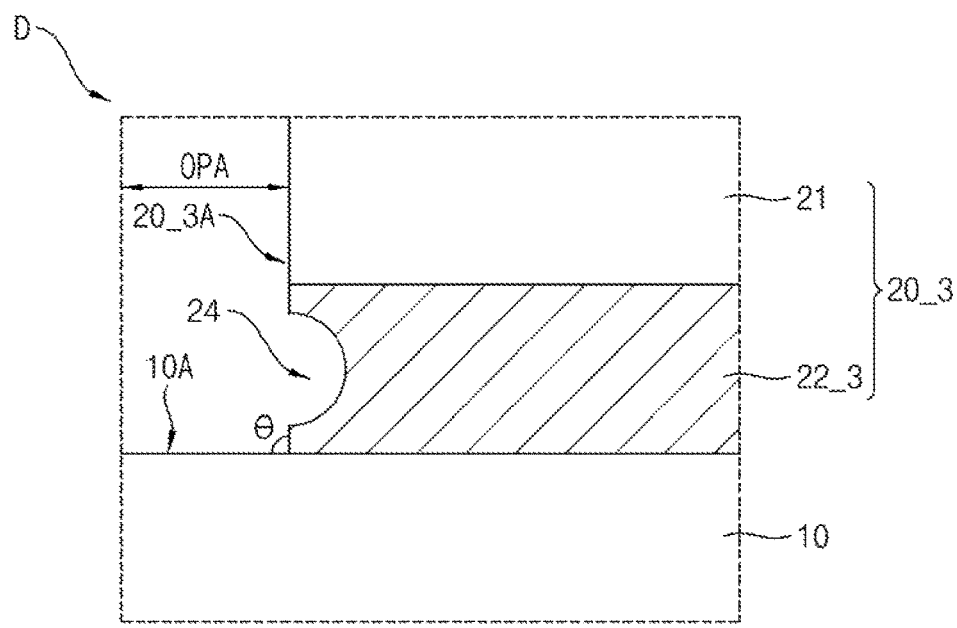
FIG. 16 is an enlarged view of a region D of FIG. 15.

FIG. 15 is a cross-sectional view of a partial region of a mother substrate 10 with a carrier film 20_3 attached thereon, according to an embodiment of the disclosure. FIG. 16 is an enlarged view of a region D of FIG. 15.

Referring to FIGS. 15 and 16, comparing with the carrier film 20 according to the embodiment of FIG. 4, the carrier film 20_3 according to the present embodiment may have a difference in that an adhesive layer 22_3 may include at least one groove 24 in a sidewall thereof.

In an implementation, the at least one groove 24 formed inward may be formed in the sidewall of the adhesive layer 22_3. Due to the at least one groove 24, a surface area may increase. Accordingly, in the washing process S150, an area of the adhesive layer 22_3 contacting a solvent may increase, and the adhesive layer 22_3 may be easily removed.

In an implementation, an angle θ between the mother substrate 10 and a portion, which is adjacent to the mother substrate 10, of a sidewall 20_3A of the opening OPN may be roughly a right angle (e.g., about 90 degrees).

Figure 17:
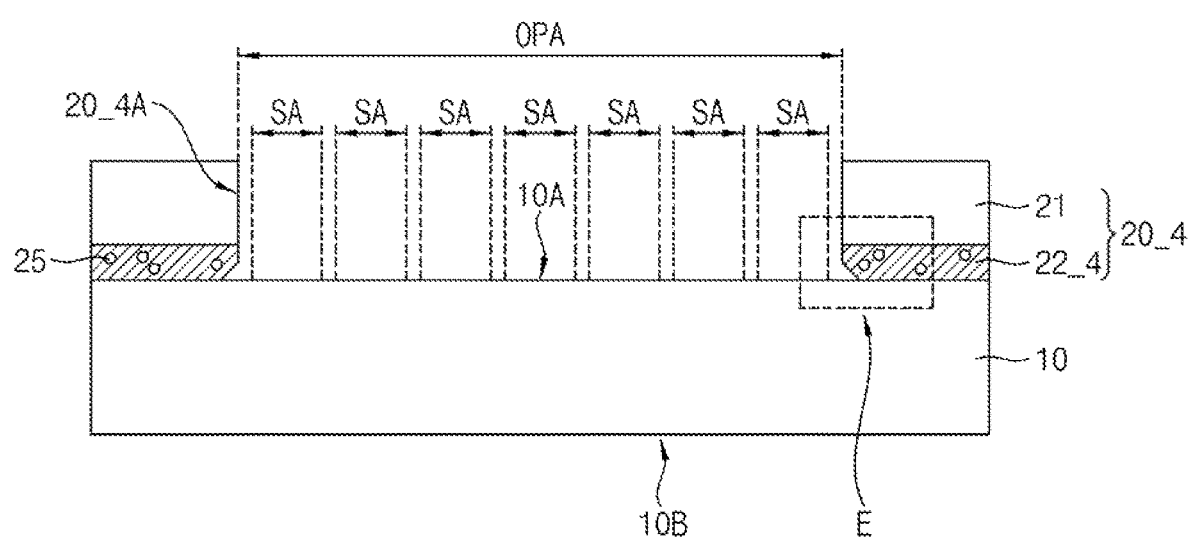
FIG. 17 is a cross-sectional view of a partial region of a mother substrate with a carrier film attached thereon, according to an embodiment of the disclosure.
Figure 18:
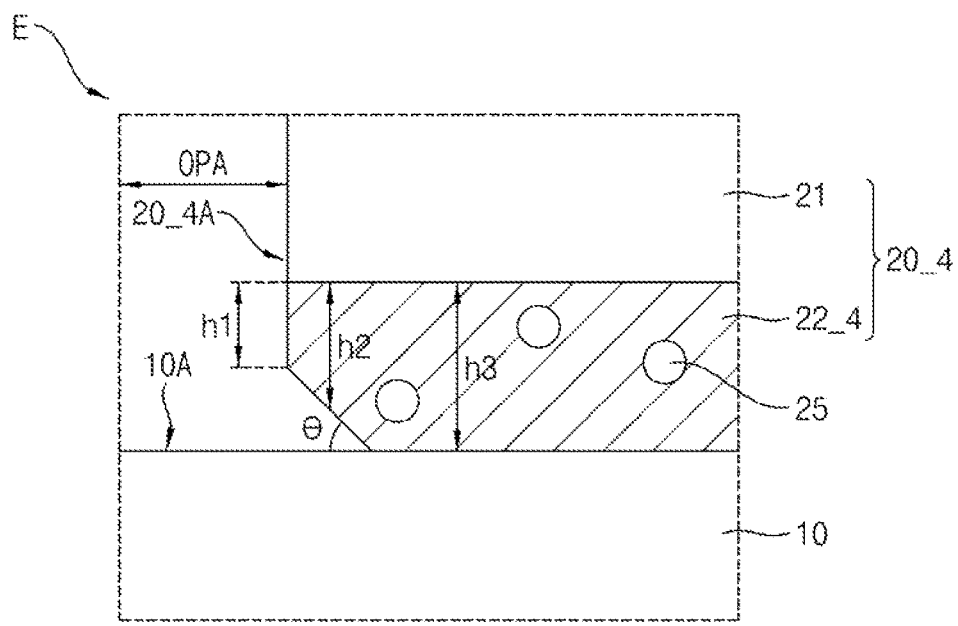
FIG. 18 is an enlarged view of a region E of FIG. 17.

FIG. 17 is a cross-sectional view of a partial region of a mother substrate 10 with a carrier film 20_4 attached thereon, according to an embodiment of the disclosure. FIG. 18 is an enlarged view of a region E of FIG. 17.

Referring to FIGS. 17 and 18, comparing with the carrier film 20 according to the embodiment of FIG. 4, the carrier film 20_4 according to the present embodiment may have a difference in that an adhesive layer 22_4 may include an air cell 25 (e.g., an air bubble) therein.

In an implementation, the adhesive layer 22_4 may include a plurality of air cells 25 therein. Due to the plurality of air cells 25, in the washing process S150, the adhesive layer 22_4 may react to a solvent, and a surface area may increase. In an implementation, the adhesive layer 22_4 may be easily removed in the washing process S150. In an implementation, each of the plurality of air cells 25 may be in the form of a void.

In an implementation, an angle between the mother substrate 10 and a portion, which is adjacent to the mother substrate 10, of a sidewall 20_4A of the opening OPN may be an acute angle.

Figure 19:
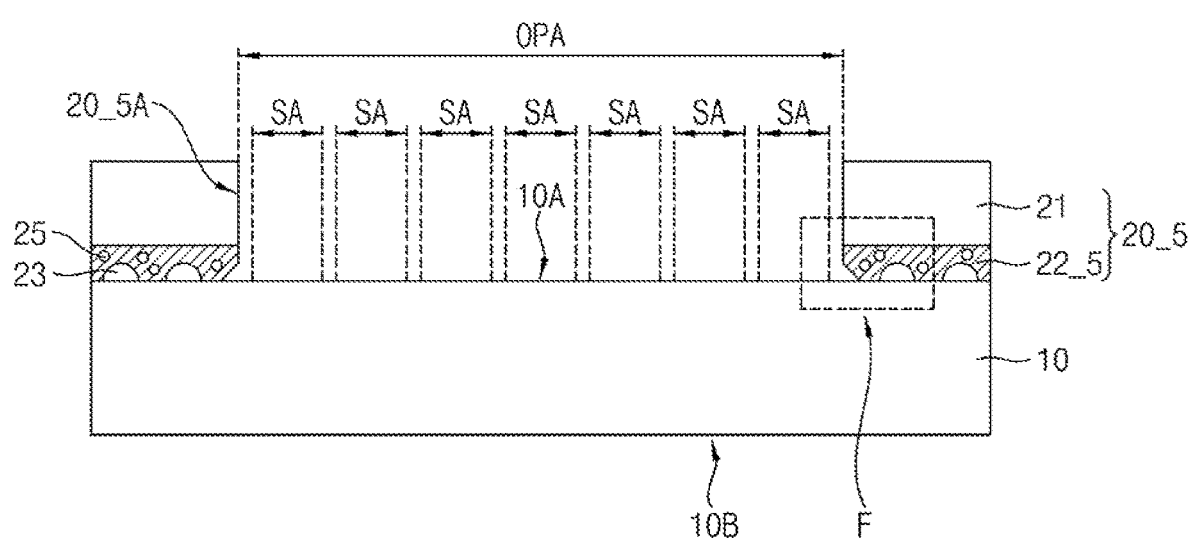
FIG. 19 is a cross-sectional view of a partial region of a mother substrate with a carrier film attached thereon, according to an embodiment of the disclosure.
Figure 20:
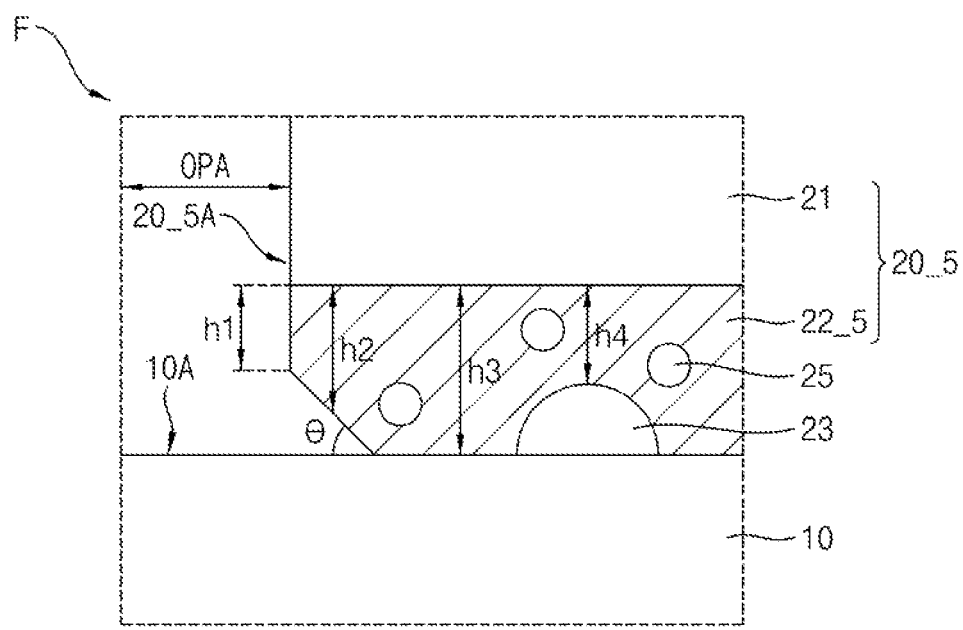
FIG. 20 is an enlarged view of a region F of FIG. 19.

FIG. 19 is a cross-sectional view of a partial region of a mother substrate 10 with a carrier film 20_5 attached thereon, according to an embodiment of the disclosure. FIG. 20 is an enlarged view of a region F of FIG. 19.

Referring to FIGS. 19 and 20, comparing with the carrier film 20 according to the embodiment of FIG. 4, the carrier film 20_5 according to the present embodiment may have a difference in that an adhesive layer 22_5 may include at least one groove 23 in one surface thereof and an air cell 25 therein.

In an implementation, the at least one groove 23 may be formed inwardly may be formed in a sidewall or a bottom (e.g., mother substrate 10-facing) surface of the adhesive layer 22_5, and the adhesive layer 22_5 may also include the plurality of air cells 25 therein.

In an implementation, an angle between the mother substrate 10 and a portion, which is adjacent to the mother substrate 10, of a sidewall 20_5A of the opening OPN may be an acute angle.

Figure 21:
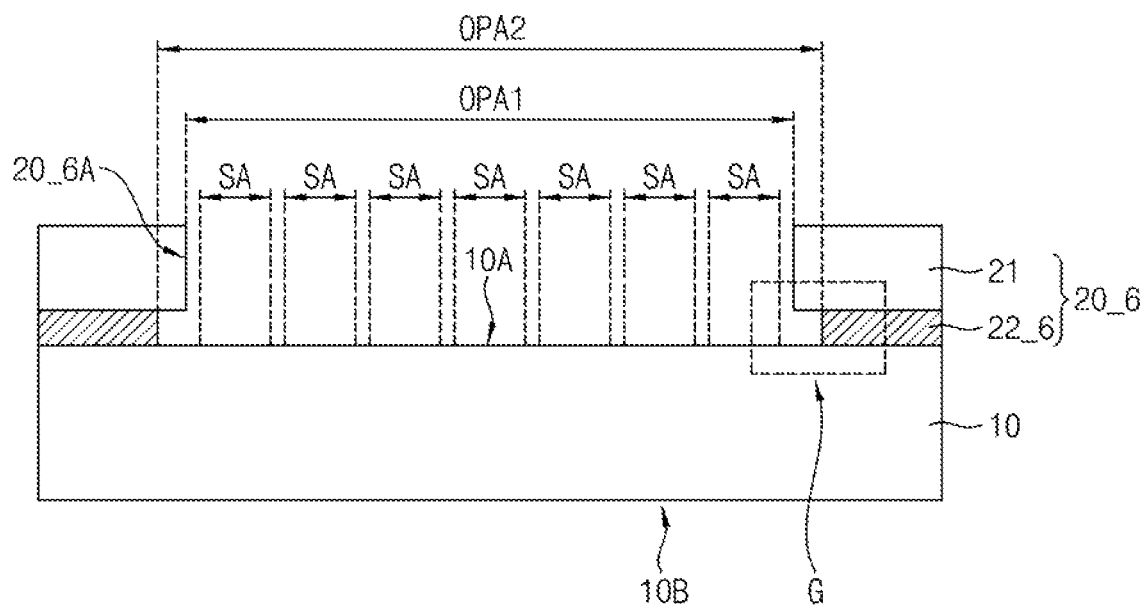
FIG. 21 is a cross-sectional view of a partial region of a mother substrate with a carrier film attached thereon, according to an embodiment of the disclosure.
Figure 22:
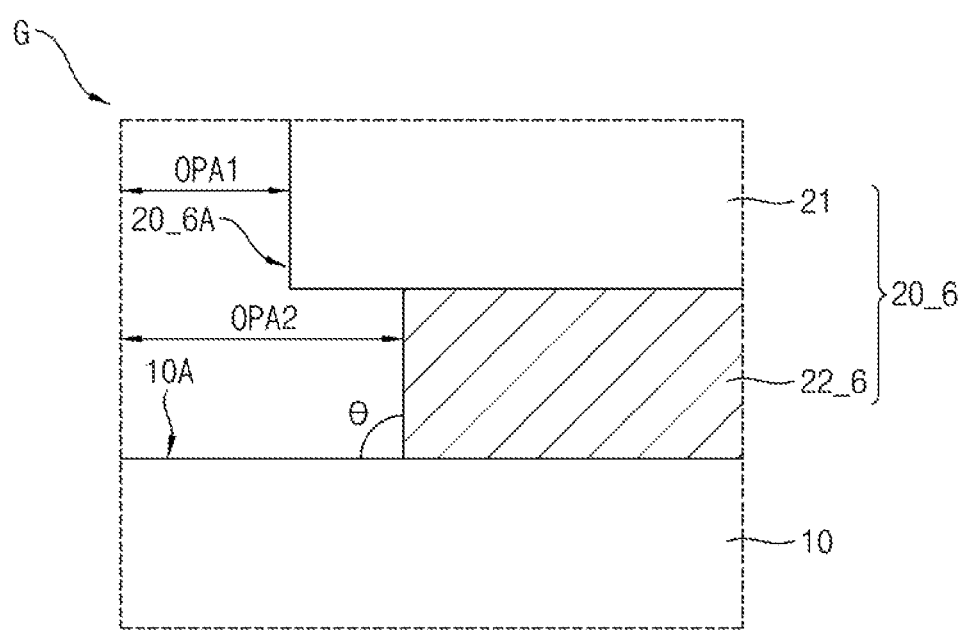
FIG. 22 is an enlarged view of a region G of FIG. 21.

FIG. 21 is a cross-sectional view of a partial region of a mother substrate 10 with a carrier film 20_6 attached thereon, according to an embodiment of the disclosure. FIG. 22 is an enlarged view of a region G of FIG. 21.

Referring to FIGS. 21 and 22, comparing with the carrier film 20 according to the embodiment of FIG. 4, the carrier film 20_6 according to the present embodiment may have a difference in that a width of an opening includes another portion thereof.

In an implementation, a width of an opening OPN1 in the base material layer 21 may differ from that of an opening OPN2 in an adhesive layer 22_6. In an implementation, a width of the opening OPN2 in the adhesive layer 22_6 may be greater than that of the opening OPN1 in the base material layer 21. A contact area between the adhesive layer 22_6 and a first surface 10A of the mother substrate 10 may be relatively decreased, and thus, the adhesive layer 22_6 may be easily removed in the washing process S150.

Figure 23:
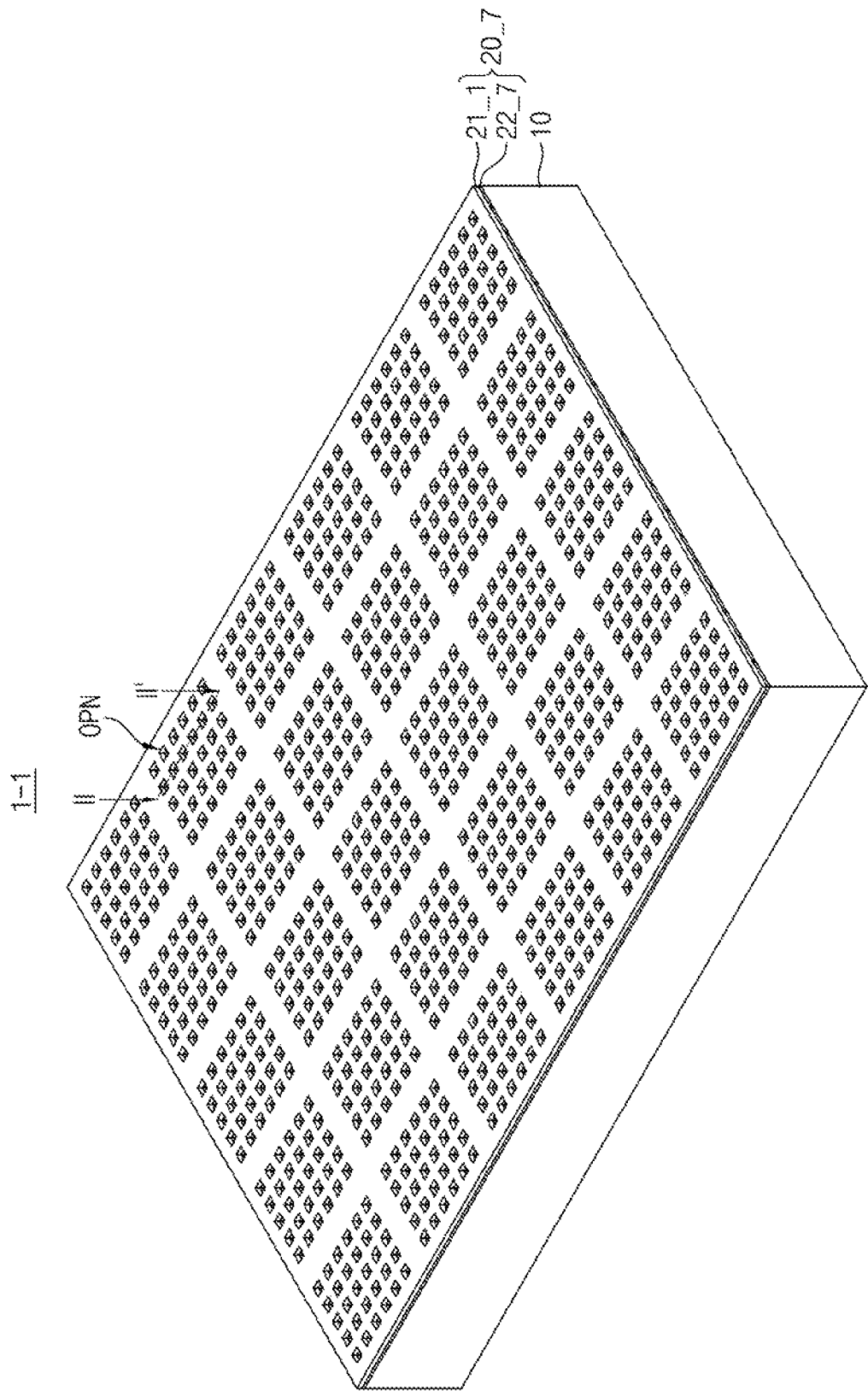
FIG. 23 is a perspective view of a mother substrate with a carrier film attached thereon, according to an embodiment of the disclosure.
Figure 24:
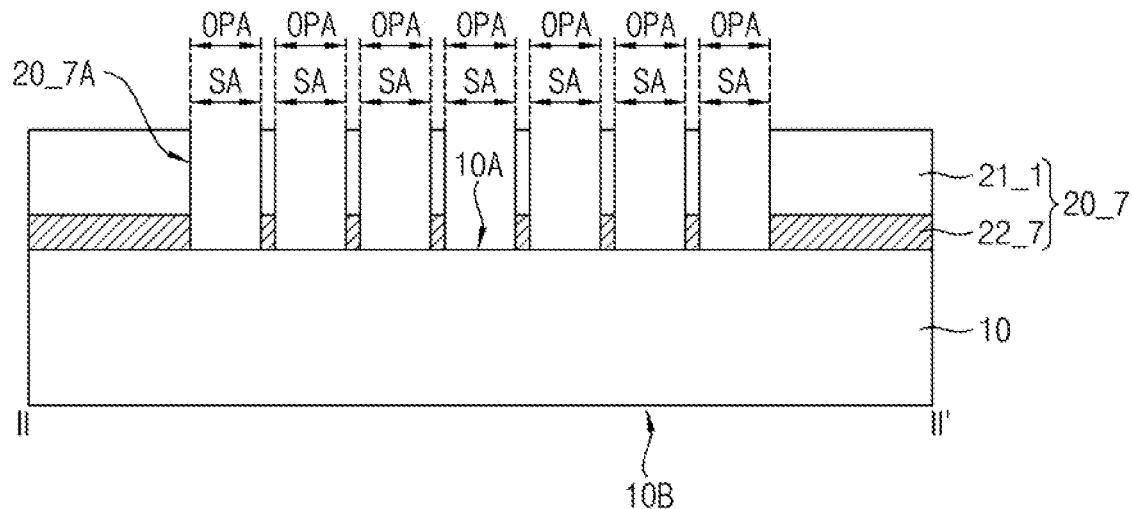
FIG. 24 is a cross-sectional view taken along line II-IF of FIG. 23.

FIG. 23 is a perspective view of a mother substrate 10 with a carrier film 20_7 attached thereon, according to an embodiment of the disclosure. FIG. 24 is a cross-sectional view taken along line II-IF of FIG. 23.

Referring to FIGS. 23 and 24, comparing with the carrier film 20 according to the embodiment of FIGS. 1 and 4, the carrier film 20_7 according to the present embodiment may have a difference in that an opening OPN may be formed in order for each of a plurality of open areas OPA to have the same width as that of a solder ball area SA.

In an implementation, the carrier film 20_7 may include a plurality of openings OPN, each having the same width as that of a solder ball 50. Accordingly, an open area OPA having the same width as that of the solder ball area SA in a first surface 10A of the mother substrate 10 may be defined.

In an implementation, the mother substrate 10 may be provided as a type 1-1 where the carrier film 20_7 is attached thereon in the semiconductor package process.

Figure 25:
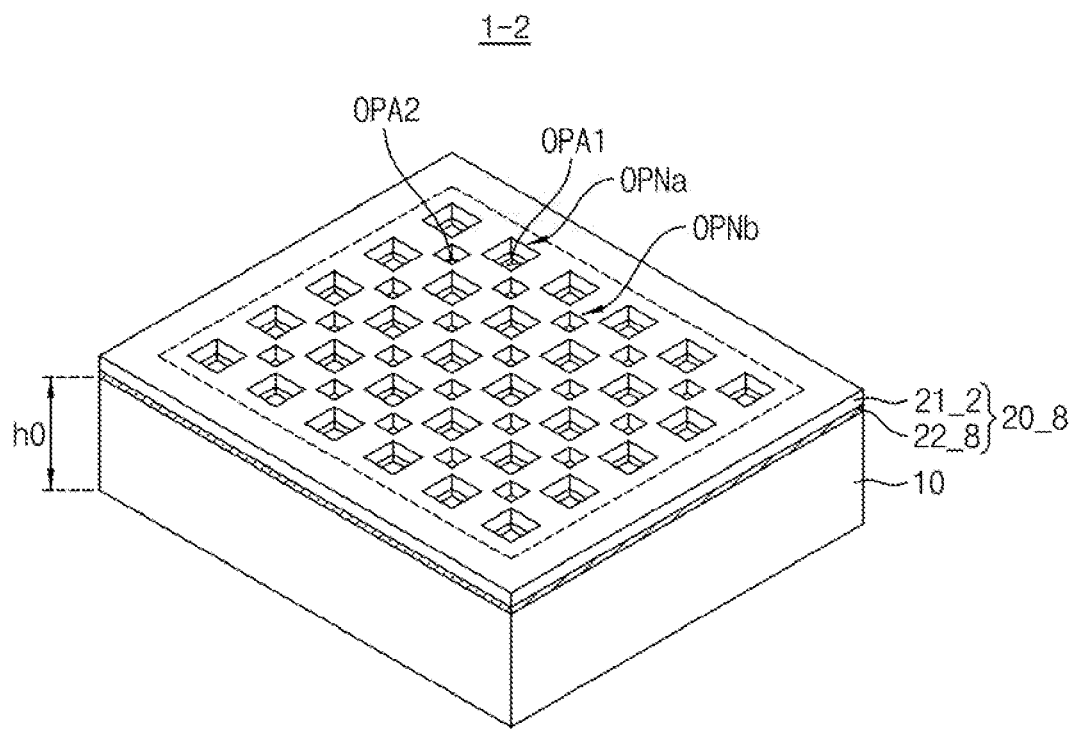
FIG. 25 is a perspective view of a mother substrate with a carrier film attached thereon, according to an embodiment of the disclosure.

FIG. 25 is a schematic perspective view illustrating a mother substrate 10 with a carrier film 20_8 attached thereon, according to an embodiment of the disclosure.

Referring to FIG. 25, comparing with the carrier film 20 according to the embodiment of FIG. 4, the carrier film 20_8 according to the present embodiment may have a difference in that the carrier film 20_8 includes a plurality of first openings OPNa, defining a first open area OPA1 including a solder ball area SA where a plurality of solder balls 50 are formed in or on a first surface 10A of the mother substrate 10, and a plurality of second openings OPNb defining a second open area OPA2 including an area where the plurality of solder balls 50 are not formed.

In an implementation, the carrier film 20_8 may include the plurality of first openings OPNa and the plurality of second openings OPNb. Here, the plurality of first openings OPNa may have the same function as that of each opening OPN (see FIGS. 1 to 4) described above in the embodiments.

The plurality of second openings OPNb may be formed so that, when the carrier film 20_8 is attached on the mother substrate 10, a second open area OPA2 of the first surface 10A of the mother substrate 10 is exposed.

The second open area OPA2 of the mother substrate 10 may not include a solder ball area SA. In an implementation, a plurality of solder balls 50 may not be formed in the second open area OPA2 of the mother substrate 10.

In an implementation, a width of each of the plurality of first openings OPNa may differ from that of each of the plurality of second openings OPNb. In an implementation, in the carrier film 20_8, a width of each of the plurality of first openings OPNa may be greater than that of each of the plurality of second openings OPNb.

In an implementation, the mother substrate 10 may be provided as a type 1-2 where the carrier film 20_8 is attached thereon in the semiconductor package process.

By way of summation and review, as a thickness of a substrate is thinned, phenomena such as deviation of equipment and breaking of substrates could occur in the semiconductor package process due to insufficient stiffness.

In order to address such phenomena, e.g., a method may include attaching a carrier film or a carrier substrate on one surface of a substrate with a semiconductor chip mounted thereon and a surface opposite to the one surface of the substrate.

According to the embodiments of the disclosure, a carrier film may be detached from a mother substrate by using a minimum process and at a minimum cost in a semiconductor package process.

In addition, the amount of residual remaining in the mother substrate may be minimized in a process of detaching the carrier film from the mother substrate.

One or more embodiments may provide a carrier film that supports a mother substrate and is easily detached therefrom in a semiconductor package process.

One or more embodiments may provide a method of detaching a carrier film from a mother substrate with the carrier film attached thereon by using a minimized process in a semiconductor package process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A carrier film disposed on a mother substrate that includes a multi-layer circuit, the carrier film comprising:
   a base material layer; and
   an adhesive layer configured to attach the base material layer onto the mother substrate,
   wherein:
   the carrier film includes a plurality of openings passing therethrough from a top surface to a bottom surface thereof,
   the mother substrate includes a first surface on which the carrier film is attachable, a second surface including a plurality of semiconductor chips attached thereon, and a plurality of open areas on the first surface of the mother substrate and exposed by the plurality of openings of the carrier film, each of the plurality of open areas includes a solder ball area respectively including a plurality of solder balls thereon, and the plurality of openings of the carrier film overlap the solder ball area of the mother substrate, wherein the adhesive layer includes a water soluble material.

2. The carrier film of claim 1, wherein the base material layer has a predetermined stiffness.

3. The carrier film of claim 2, wherein the base material layer includes polycarbonate, acrylic resin, polyethylene terephthalate, poly ether sulfide, or polysulfone.

4. The carrier film of claim 1, wherein the base material layer includes a water soluble material.

5. The carrier film of claim 4, wherein the base material layer includes poly vinyl alcohol (PVA), carboxymethyl cellulose (CMC), carboxymethyl starch (CMS), or a combination thereof.

6. The carrier film of claim 1, wherein the adhesive layer includes poly vinyl acetate (PVAc), water soluble polyurethane (PU), water soluble poly vinyl alcohol (PVA), carboxymethyl cellulose (CMC), carboxymethyl starch (CMS), or a combination thereof.

7. The carrier film of claim 1, wherein the adhesive layer includes a biodegradable material.

8. The carrier film of claim 7, wherein the adhesive layer includes a starch or a vegetable oil.

9. The carrier film of claim 1, wherein the multi-layer circuit is between the first surface and the second surface.

10. A carrier film disposed on a mother substrate that includes a multi-layer circuit, the carrier film comprising:

a base material layer; and an adhesive layer configured to attach the base material layer onto the mother substrate, wherein:

the carrier film includes a plurality of openings passing therethrough from a top surface to a bottom surface thereof, the mother substrate includes a first surface on which the carrier film is attachable, a second surface including a plurality of semiconductor chips attached thereon, and a plurality of open areas on the first surface of the mother substrate and exposed by the plurality of openings of the carrier film, each of the plurality of open areas includes a solder ball area respectively including a plurality of solder balls thereon, the plurality of openings of the carrier film overlap the solder ball area of the mother substrate, and a group of solder balls among the plurality of solder balls is disposed in each opening of the plurality of openings.

11. The carrier film of claim 10, wherein the base material layer has a predetermined stiffness.

12. The carrier film of claim 11, wherein the base material layer includes polycarbonate, acrylic resin, polyethylene terephthalate, poly ether sulfide, or polysulfone.

13. The carrier film of claim 10, wherein the base material layer includes a water soluble material.

14. The carrier film of claim 13, wherein the base material layer includes poly vinyl alcohol (PVA), carboxymethyl cellulose (CMC), carboxymethyl starch (CMS), or a combination thereof.

15. The carrier film of claim 10, wherein the adhesive layer includes a water soluble material.

16. The carrier film of claim 15, wherein the adhesive layer includes poly vinyl acetate (PVAc), water soluble polyurethane (PU), water soluble poly vinyl alcohol (PVA), carboxymethyl cellulose (CMC), carboxymethyl starch (CMS), or a combination thereof.

17. The carrier film of claim 15, wherein the adhesive layer includes a biodegradable material.

18. The carrier film of claim 17, wherein the adhesive layer includes a starch or a vegetable oil.

19. The carrier film of claim 10, wherein the multi-layer circuit is between the first surface and the second surface.

\* \* \* \* \*